(12) United States Patent
Ye et al.

(10) Patent No.: US 11,415,843 B2
(45) Date of Patent: Aug. 16, 2022

(54) DISPLAY PANEL AND LIQUID CRYSTAL DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventors: Yanxi Ye, Shenzhen (CN); Shenghong Li, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 280 days.

(21) Appl. No.: 16/624,374

(22) PCT Filed: Nov. 5, 2019

(86) PCT No.: PCT/CN2019/115604
§ 371 (c)(1),
(2) Date: Dec. 19, 2019

(87) PCT Pub. No.: WO2021/022692
PCT Pub. Date: Feb. 11, 2021

(65) Prior Publication Data
US 2021/0405482 A1 Dec. 30, 2021

(30) Foreign Application Priority Data
Aug. 6, 2019 (CN) .......................... 201910722513.6

(51) Int. Cl.
G02F 1/1345 (2006.01)
G02F 1/1362 (2006.01)
H05K 1/18 (2006.01)

(52) U.S. Cl.
CPC ........ *G02F 1/1345* (2013.01); *G02F 1/13452* (2013.01); *G02F 1/13454* (2013.01);
(Continued)

(58) Field of Classification Search
CPC ........... G02F 1/136286; G02F 1/13452; G02F 1/13454; G02F 1/1345
See application file for complete search history.

(56) References Cited

U.S. PATENT DOCUMENTS 7,629,735 B2 12/2009 Ryu
2014/0085585 A1* 3/2014 Sung ................... G02F 1/13458
445/25

(Continued)

FOREIGN PATENT DOCUMENTS

CN 101118832 A 2/2008
CN 108447891 A 8/2018
(Continued)

*Primary Examiner* — Dung T Nguyen
(74) *Attorney, Agent, or Firm* — Dickinson Wright PLLC

(57) ABSTRACT

The present disclosure provides a display panel and a liquid crystal display device. The display panel includes an array substrate and a flexible thin film. The array substrate has a first surface, a second surface disposed opposite to and in parallel with the first surface, and a first side surface connected to the first surface and the second surface. The first surface of the array substrate is on a same side as a light-emitting surface of the array substrate, and the flexible thin film is disposed on a side of the second surface of the array substrate. The display panel and the liquid crystal display device have narrow frames.

14 Claims, 2 Drawing Sheets

(52) U.S. Cl.
CPC .. *G02F 1/136222* (2021.01); *G02F 1/136286* (2013.01); *H05K 1/189* (2013.01); *H05K 2201/10136* (2013.01)

(56) References Cited

U.S. PATENT DOCUMENTS

| | | | |
|---|---|---|---|
| 2014/0240933 A1* | 8/2014 | Lee | G06F 1/1656 361/749 |
| 2015/0153607 A1* | 6/2015 | Chen | G02F 1/133305 349/65 |
| 2017/0170255 A1* | 6/2017 | Ha | H01L 27/3276 |

FOREIGN PATENT DOCUMENTS

| | | | |
|---|---|---|---|
| CN | 108681119 A | 10/2018 |
| CN | 108957878 A | 12/2018 |
| CN | 109709697 A | 5/2019 |

* cited by examiner

DISPLAY PANEL AND LIQUID CRYSTAL DISPLAY DEVICE

FIELD OF INVENTION

The present disclosure relates to the field of display technologies, and more particularly, to a display panel and a liquid crystal display device.

BACKGROUND OF INVENTION

At present, electrode lines of liquid crystal display (LCD) devices are disposed on a glass of a step region of an array substrate by a chip on film (COF) bonded to the glass of the step region to make a circuit in a display area of a liquid crystal display device electrically connected to a driver chip (driving integrated circuit). The industries develop an advanced technique, that is, a side bonding technique. The side bonding technique disposes electrode lines on a side surface of an array substrate, which is flush with a side surface of a color filter substrate. Since a chip on film cannot be directly connected to a section of in-plane electrode lines of a display area, it needs to dispose a layer of side surface electrode lines on a side surface of the glass, and then to bond a chip on film to the side surface electrode lines, thereby achieving electrical connection between a liquid crystal cell circuit and a driver chip. The side bonding technique can reduce spaces occupied by an outer lead bonding (OLB) area for bonding a driver chip, so in general, it is suitable for an LCD narrow frame technique. However, a chip on film and a driver chip of the side bonding technique are necessary to be disposed on a side surface of a liquid crystal display panel, which occupies spaces on a side of a liquid crystal display panel and is unfavorable for liquid crystal display panels to further achieve narrow frames.

An objective of the present disclosure is to provide a display panel and a liquid crystal display device having narrow frames.

SUMMARY OF INVENTION

A display panel comprises an array substrate and a flexible thin film. Wherein the array substrate has a first surface, a second surface disposed opposite to and in parallel with the first surface, and a first side surface connected to the first surface and the second surface; wherein the first surface of the array substrate is on a same side as a light-emitting surface of the array substrate, and the flexible thin film is disposed on a side of the second surface of the array substrate.

In the above display panel, the display panel further comprises a plurality of first wires and a plurality of second wires, wherein the first wires are disposed on the first surface of the array substrate, the second wires extend from the first side surface of the array substrate to the second surface of the array substrate, and each of the first wires is in contact with each of the second wires.

In the above display panel, wherein a width of the first wires is greater than a width of the second wires.

In the above display panel, the array substrate further comprises an inclined plane, the inclined plane is connected to the first side surface of the array substrate and the second surface of the array substrate, the second wires extend from the first side surface of the array substrate to the inclined plane of the array substrate and extend from the inclined plane of the array substrate to the second surface of the array substrate.

In the above display panel, the display panel further comprises a color filter substrate, wherein the color filter substrate has a second side surface corresponding to and flush with the first side surface of the array substrate, and the second wires extend to the second side surface of the color filter substrate.

In the above display panel, the display panel further comprises a protective layer covering the second wires.

In the above display panel, an outer peripheral edge of the color filter substrate is flush with an outer peripheral edge of the array substrate.

In the above display panel, wherein the color filter substrate comprises a substrate and a first color filter layer disposed in a display area of the substrate, the display panel further comprises frame glue disposed between the substrate and the array substrate, an outer peripheral edge of the frame glue is flush with outer peripheral edges of the color filter substrate and the array substrate, and the second wires extend to a side surface of the frame glue and extend from the side surface of the frame glue to the second side surface of the color filter substrate.

In the above display panel, wherein the color filter substrate comprises a substrate, a first color filter layer disposed on the substrate, and a second color filter layer disposed on the substrate; wherein the second color filter layer is disposed outside the first color filter layer and adjacent to an outer edge of the color filter substrate, and the second wires extend from the array substrate to a side surface of the second color filter layer and extend from the side surface of the second color filter layer to the substrate.

In the above display panel, wherein the second wires are formed by printing.

In the above display panel, wherein the flexible thin film is a chip on film, a driver chip is disposed on the flexible thin film, the display panel further comprises a flexible printed circuit board, the flexible printed circuit board is connected to the flexible thin film, and the driver chip is electrically connected to the second wires.

In the above display panel, wherein the flexible thin film is a flexible printed circuit board, the display panel further comprises a driver chip electrically connected to the flexible thin film, the driver chip is bonded to the second surface of the array substrate, and the driver chip is electrically connected to the second wires.

A liquid crystal display device comprises a display panel and a backlight module. The display panel comprises an array substrate and a flexible thin film; wherein the array substrate has a first surface, a second surface disposed opposite to and in parallel with the first surface, and a first side surface connected to the first surface and the second surface; wherein the first surface of the array substrate is on a same side as a light-emitting surface of the array substrate, and the flexible thin film is disposed on a side of the second surface of the array substrate; the backlight module is disposed on a side of the flexible thin film of the array substrate, and the flexible thin film is disposed between the backlight module and the display panel.

In the above liquid crystal display device, wherein the display panel further comprises a plurality of first wires and a plurality of second wires, the first wires are disposed on the first surface of the array substrate, the second wires extend from the first side surface of the array substrate to the second surface of the array substrate, and each of the first wires is in contact with each of the second wires.

In the above liquid crystal display device, wherein a width of the first wires is greater than a width of the second wires.

In the above liquid crystal display device, wherein the array substrate further comprises an inclined plane, the inclined plane is connected to the first side surface of the array substrate and the second surface of the array substrate, the second wires extend from the first side surface of the array substrate to the inclined plane of the array substrate and extend from the inclined plane of the array substrate to the second surface of the array substrate.

In the above liquid crystal display device, wherein the display panel further comprises a color filter substrate, the color filter substrate has a second side surface corresponding to and flush with the first side surface of the array substrate, and the second wires extend to the second side surface of the color filter substrate.

In the above liquid crystal display device, wherein an outer peripheral edge of the color filter substrate is flush with an outer peripheral edge of the array substrate.

In the above liquid crystal display device, wherein the color filter substrate comprises a substrate and a first color filter layer disposed in a display area of the substrate, the display panel further comprises frame glue disposed between the substrate and the array substrate, an outer peripheral edge of the frame glue is flush with outer peripheral edges of the color filter substrate and the array substrate, and the second wires extend to a side surface of the frame glue and extend from the side surface of the frame glue to the second side surface of the color filter substrate.

In the above liquid crystal display device, wherein the color filter substrate comprises a substrate, a first color filter layer disposed on the substrate, and a second color filter layer disposed on the substrate; wherein the second color filter layer is disposed outside the first color filter layer and adjacent to an outer edge of the color filter substrate, and the second wires extend from the array substrate to a side surface of the second color filter layer and extend from the side surface of the second color filter layer to the substrate.

Beneficial effect: the present disclosure provides a display panel and a liquid crystal display device by disposing a flexible thin film on a backside of a light-emitting surface of an array substrate to make the display panel and the liquid crystal display device have narrow frames.

DETAILED DESCRIPTION OF PREFERRED EMBODIMENTS

The embodiments of the present disclosure are described in detail hereinafter. Examples of the described embodiments are given in the accompanying drawings. The specific embodiments described with reference to the attached drawings are all exemplary and are intended to illustrate and interpret the present disclosure. Based on the embodiments in the present disclosure, all other embodiments obtained by those skilled in the art without creative efforts are within the scope of the present disclosure.

Figure 1:
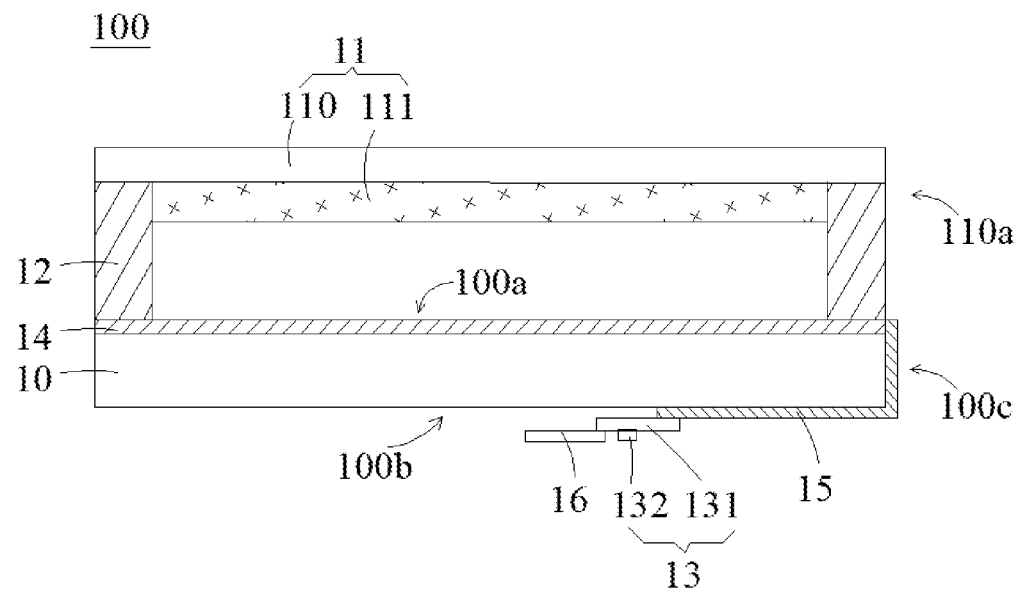
FIG. 1 is a schematic structural diagram of a display panel according to the first embodiment of the present disclosure.

Referring to FIG. 1, FIG. 1 is a schematic structural diagram of a display panel according to the first embodiment of the present disclosure. Display panels of the present disclosure can be light-emitting diode display panels or liquid crystal display panels. The following uses a liquid crystal display panel to describe technical solutions of the present disclosure. A display panel 100 comprises an array substrate 10, a color filter substrate 11, a frame glue 12, a flexible thin film 13, a plurality of first wires 14, and a plurality of second wires 15.

The array substrate 10 has a first surface 100a, a second surface 100b disposed opposite to and in parallel with the first surface 100a, and a first side surface 100c connected to the first surface 100a and the second surface 100b. Wherein the first surface 100a of the array substrate 10 is on a same side as a light-emitting surface of the array substrate 10. The second surface 100b of the array substrate 10 is disposed on a backside surface of the light-emitting surface of the array substrate 10. The first side surface 100c is perpendicular to the first surface 100a and the second surface 100b.

A plurality of first wires 14 are data lines on the array substrate 10 and peripheral lines electrically connected to a gate driving circuit. A plurality of the first wires 14 are disposed on the first surface 100a of the array substrate 10. A thickness of each first wire 14 ranges from 2500 Å to 3500 Å, and a width of each first wire 14 ranges from 20 μm to 35 μm. The first wires 14 are obtained by forming a first conductive layer on the first surface 100a of the array substrate, then coating a photoresist on the first conductive layer, using a mask to expose the partial photoresist, using a developer to remove the partial photoresist, using an etching process to remove the first conductive layer which is not covered by the photoresist, and removing the remaining photoresist. A preparing material of the first wires 14 comprises, but is not limited to, molybdenum, aluminum, titanium, gold, copper, hafnium, tantalum, or alloys thereof.

A plurality of the second wires 15 extend from the first side surface 100c of the array substrate 10 to the second surface 100b of the array substrate 10. The second wires 15 are formed by printing. Specifically, a plurality of the second wires 15 are formed by transfer printing technology or screen-printing technology. The second wires 15 are formed by printing a silver paste on the second surface 100b of the array substrate 10 and the first side surface 100c of the array substrate 10, and then evaporating a solvent of the silver paste. The silver paste comprises nano silver particles and a solvent for the nano silver particles. That is, the second wires 15 are silver lines.

Each of the first wires 14 is in contact with each of the second wires 15. A surface of the second wires 15 is in contact with a cross-sectional surface in a thickness direction of the first wires 14. A width of the first wires 14 is greater than a width of the second wires 15 that makes the first wires 14 completely in contact with the second wires 15, thereby increasing contact yield of the first wires 14 and the second wires 15. It should be understood that the width of the first wires 14 can be less than the width of the second wires 15.

The flexible thin film 13 is disposed on a side of the second surface 100b of the array substrate 10. The flexible thin film 13 is a chip on film. The chip on film 13 comprises a flexible substrate 131 and a driver chip 132 disposed on the flexible substrate 131. That is, the driver chip 132 is disposed on the chip on film. The driver chip 132 is electrically connected to the second wires 15 to make electrical signals of the driver chip 132 output to the first wires 14 through the second wires 15, thereby controlling the display panel to display images. The display panel 100 also comprises a flexible printed circuit board 16. The flexible printed circuit board 16 is connected to the flexible thin film 13 to make electrical signals of the flexible printed circuit board 16 output to the driver chip 132 of the flexible thin film 13.

The color filter substrate 11 is disposed opposite to the array substrate 10, and the color filter substrate 11 is disposed on a side of the first surface 100a of the array substrate 10. An outer peripheral edge of the color filter substrate 11 is flush with an outer peripheral edge of the array substrate 10. The color filter substrate 11 has a second side surface 110a corresponding to and flush with the first side surface 100c of the array substrate 10. Specifically, the color filter substrate 11 comprises a substrate 110 and a first color filter layer 111 disposed in a display area of the substrate 110. The second side surface 110a of the color filter substrate 11 is a side surface on a same side as the first side surface 100c of the array substrate 10. The color filter substrate 11 and the array substrate 10 are bonded by the frame glue 12 to form the display panel 100. Specifically, the frame glue 12 is disposed between the substrate 110 and the array substrate 10. An outer peripheral edge of the frame glue 12 is flush with outer peripheral edges of the color filter substrate 11 and the array substrate 10. A width of the frame glue 12 ranges from 1000 μm to 2000 μm.

The embodiment of the present disclosure makes the display panel have a narrow frame by disposing the flexible thin film on a backside of the light-emitting surface of the array substrate to make the flexible thin film not occupy spaces of side surface of the display panel but occupy spaces of the backside of the light-emitting surface of the display panel.

Figure 2:
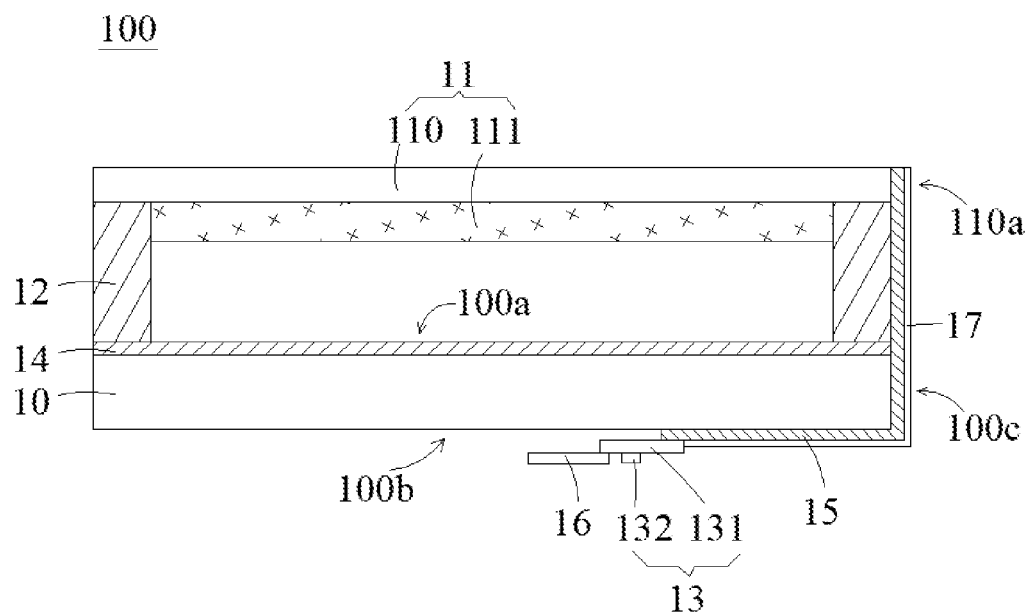
FIG. 2 is a schematic structural diagram of a display panel according to the second embodiment of the present disclosure.

Referring to FIG. 2, FIG. 2 is a schematic structural diagram of a display panel according to the second embodiment of the present disclosure. The display panel 100 shown in FIG. 2 is basically similar to that shown in FIG. 1. The difference is that a plurality of the second wires 15 extend to the second side surface 110a of the color filter substrate 11. In the embodiment, a plurality of the second wires 15 extend to a side surface of the frame glue 12, and then extend from the side surface of the frame glue 12 to the second side surface 110a of the color filter substrate 11 that makes the second wires 15 not easily peeled off from the display panel 100. Furthermore, the display panel 100 further comprises a protective layer 17. The protective layer 17 covers the second wires 15 that prevents the second wires 15 to be damaged. The protective layer 17 is disposed on surfaces of the second wires 15, the first side surface 100c of the array substrate 10, partial region (the region disposing the second wires 15) of the second surface 100b of the array substrate 10, and the second side surface 110a of the color filter substrate 11. The protective layer 17 can be formed by coating. A preparing material of the protective layer 17 is an organic insulation material or an inorganic insulation material.

Figure 3:
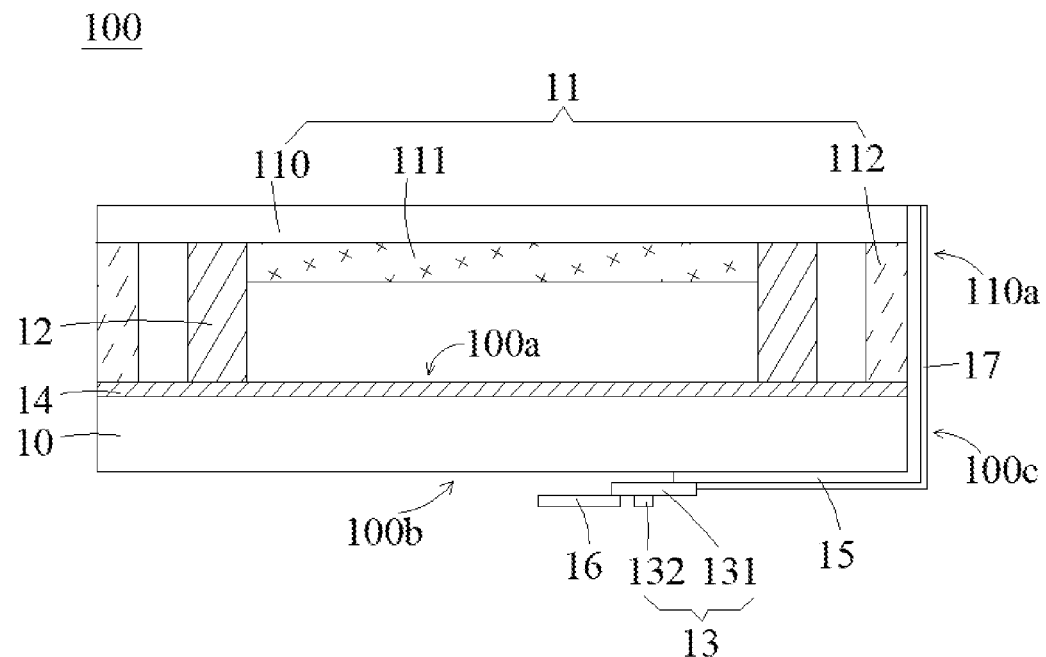
FIG. 3 is a schematic structural diagram of a display panel according to the third embodiment of the present disclosure.

Referring to FIG. 3, FIG. 3 is a schematic structural diagram of a display panel according to the third embodiment of the present disclosure. The display panel shown in FIG. 3 is basically similar to that shown in FIG. 2. The difference is that the color filter substrate 11 comprises a substrate 110, a first color filter layer 111 disposed on the substrate 110, and a second color filter layer 112 disposed on the substrate 110; wherein the second color filter layer 112 is disposed outside the first color filter layer 111 and adjacent to an outer edge of the color filter substrate 11. The second color filter layer 112 has a width ranging from 45 μm to 55 μm. A thickness of the second color filter layer 112 is greater than a thickness of the first color filter layer 111. The first color filter layer 111 and the second color filter layer 112 can be formed by a same process, or can be formed by two processes. After the color filter substrate 11 and the array substrate 10 are bonded by the frame glue 12, the frame glue 12 is disposed between the substrate 110 and the array substrate 10. The second color filter layer 112 is disposed on one side of the frame glue 12 which is adjacent to the outer peripheral edge of the color filter substrate 11. A distance between the frame glue 12 and the outer peripheral edge of the color filter substrate 11 and the array substrate 10 ranges from 100 μm to 200 μm. A thickness of the second color filter layer 112 is less than or equal to a thickness of the frame glue 12. A plurality of the second wires 15 extend from the array substrate 10 to a side surface of the second color filter layer 112 and extend from the side surface of the second color filter layer 112 to the substrate 110. The second side surface 110a comprises a side surface of the second color filter layer 112 which is corresponding to and flush with the array substrate 10 and a side surface of the substrate 110 which is corresponding to and flush with the array substrate 10.

Figure 4:
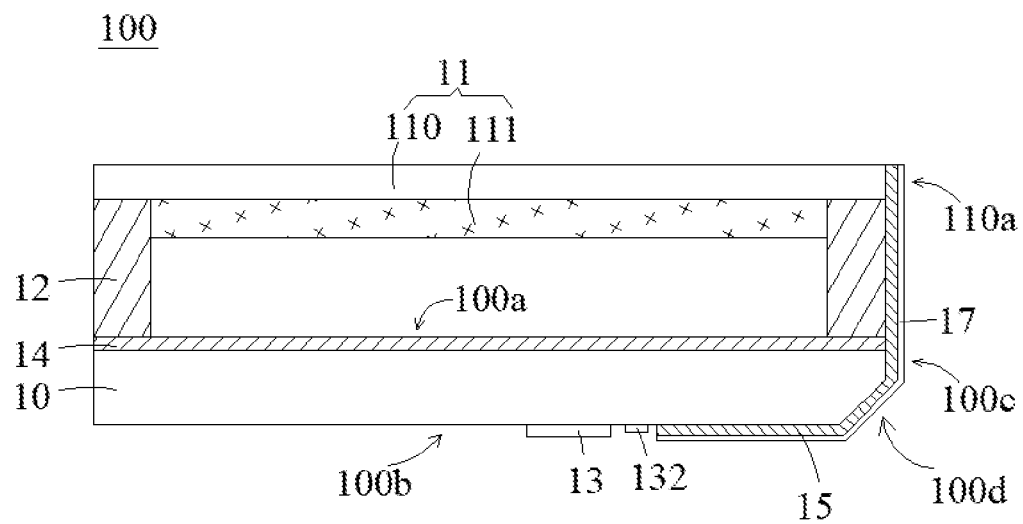
FIG. 4 is a schematic structural diagram of a display panel according to the fourth embodiment of the present disclosure.

Referring to FIG. 4, FIG. 4 is a schematic structural diagram of a display panel according to the fourth embodiment of the present disclosure. The display panel 100 shown in FIG. 4 is similar to that shown in FIG. 2. The difference is that the array substrate 10 further comprises an inclined plane 100d, the inclined plane 100d is connected to the first side surface 100c of the array substrate 10 and the second surface 100b of the array substrate 10, the second wires 15 extend from the first side surface 100c of the array substrate 10 to the inclined plane 100d of the array substrate 10 and extend from the inclined plane 100d of the array substrate 10 to the second surface 100b of the array substrate 10. Before extending from the first side surface 100c to the second surface 100b, the second wires 15 extend to the inclined plane 100d first, then extending from the inclined plane 100d to the second surface 100b to reduce the risk of breakage of the second wires 15, thereby preventing interruption of electrical signals transmitted by the second wires, which causes the display panel to display abnormally. The inclined plane 100d is formed by grinding a right angle between the first side surface 100c and the second surface 100b of the array substrate 10. A first angle between the inclined plane 100d and the first side surface 100c is greater than 90 degrees and less than 180 degrees, A second angle between the inclined plane 100d and the second surface 100b is greater than 90 degrees and less than 180 degrees, and the sum of the first angle and the second angle is 270 degrees. The first angle can be equal to the second angle. For example, both the first angle and the second angle are 135 degrees. The first angle can be not equal to the second angle. In addition, the flexible thin film 13 is a flexible printed circuit board, the display panel 100 further comprises a driver chip 132 electrically connected to the flexible thin film 13, the driver chip 132 and the flexible thin film 13 are bonded to the second surface 100b of the array substrate 10. The driver chip 132 is electrically connected to the second wires 15 that makes electrical signals of the driver chip 132 output to the first wires 14 through the second wires 15, thereby controlling displays of the display panel.

The present disclosure further provides a liquid crystal display device. The liquid crystal display device comprises the above display panel and a backlight module. The backlight module is disposed on a side of the flexible thin film of the array substrate. That is, the flexible thin film is disposed between the array substrate and the backlight module to take full advantage of the spaces between the backlight module and the display panel.

The liquid crystal display device in the embodiment of the present disclosure makes the liquid crystal display device have a narrow frame by disposing the flexible thin film on a backside of the light-emitting surface of the array substrate to make the flexible thin film not occupy spaces of side surface of the display panel, and makes the flexible thin film disposed between the backlight module and the display panel to take full advantage of the spaces between the backlight module and the display panel, thereby making the liquid crystal display device have a narrow frame.

The description of the above embodiments is only for helping to understand the technical solution of the present disclosure and its core ideas, and it is understood that many changes and modifications to the described embodiment can be carried out without departing from the scope and the spirit of the disclosure that is intended to be limited only by the appended claims.

What is claimed is:

1. A display panel, comprising an array substrate, a flexible thin film, a color filter substrate, frame glue, a plurality of first wires, and a plurality of second wires, wherein the array substrate has a first surface, a second surface disposed opposite to and in parallel with the first surface, and a first side surface connected to the first surface and the second surface; wherein the first surface of the array substrate is on a same side as a light-emitting surface of the array substrate, and the flexible thin film is totally disposed on a side of the second surface of the array substrate;

wherein the first wires are disposed on the first surface of the array substrate, the second wires extend from the first side surface of the array substrate to the second surface of the array substrate, and a surface of the second wires is in contact with a cross-sectional surface of the first wires in a thickness direction; and wherein the color filter substrate has a second side surface corresponding to and flush with the first side surface of the array substrate, the frame glue is disposed between the color filter substrate and the array substrate, an outer peripheral edge of the frame glue is flush with outer peripheral edges of the color filter substrate and the array substrate, and the second wires extend to a side surface of the frame glue and extend from the side surface of the frame glue to the second side surface of the color filter substrate.

2. The display panel according to claim 1, wherein each of the first wires is in contact with each of the second wires.

3. The display panel according to claim 1, wherein the array substrate comprises an inclined plane, the inclined plane is connected to the first side surface of the array substrate and the second surface of the array substrate, the second wires extend from the first side surface of the array substrate to the inclined plane of the array substrate and extend from the inclined plane of the array substrate to the second surface of the array substrate.

4. The display panel according to claim 1, comprising a protective layer covering the second wires.

5. The display panel according to claim 1, wherein the color filter substrate comprises a substrate and a first color filter layer disposed in a display area of the substrate, and the frame glue is disposed between the substrate and the array substrate.

6. The display panel according to claim 1, wherein the color filter substrate comprises a substrate, a first color filter layer disposed on the substrate, and a second color filter layer disposed on the substrate; wherein the second color filter layer is disposed outside the first color filter layer and adjacent to an outer edge of the color filter substrate, and the second wires extend from the array substrate to a side surface of the second color filter layer and extend from the side surface of the second color filter layer to the substrate.

7. The display panel according to claim 1, wherein the second wires are silver lines printed on the second surface and the first side surface of the array substrate.

8. The display panel according to claim 1, wherein the flexible thin film is a chip on film, a driver chip is disposed on the flexible thin film, the display panel comprises a flexible printed circuit board, the flexible printed circuit board is connected to the flexible thin film, and the driver chip is electrically connected to the second wires.

9. The display panel according to claim 1, wherein the flexible thin film is a flexible printed circuit board, the display panel comprises a driver chip electrically connected to the flexible thin film, the driver chip is bonded to the second surface of the array substrate, and the driver chip is electrically connected to the second wires.

10. A liquid crystal display device, comprising a display panel, wherein the display panel comprises an array substrate, a flexible thin film, a color filter substrate, frame glue, a plurality of first wires, and a plurality of second wires; wherein the array substrate has a first surface, a second surface disposed opposite to and in parallel with the first surface, and a first side surface connected to the first surface and the second surface; wherein the first surface of the array substrate is on a same side as a light-emitting surface of the array substrate, and the flexible thin film is totally disposed on a side of the second surface of the array substrate;

wherein the first wires are disposed on the first surface of the array substrate, the second wires extend from the first side surface of the array substrate to the second surface of the array substrate, and a surface of the second wires is in contact with a cross-sectional surface of the first wires in a thickness direction; and wherein the color filter substrate has a second side surface corresponding to and flush with the first side surface of the array substrate, the frame glue is disposed between the color filter substrate and the array substrate, an outer peripheral edge of the frame glue is flush with outer peripheral edges of the color filter substrate and the array substrate, and the second wires extend to a side surface of the frame glue and extend from the side surface of the frame glue to the second side surface of the color filter substrate.

11. The liquid crystal display device according to claim 10, wherein each of the first wires is in contact with each of the second wires.

12. The liquid crystal display device according to claim 10, wherein the array substrate comprises an inclined plane, the inclined plane is connected to the first side surface of the array substrate and the second surface of the array substrate, the second wires extend from the first side surface of the array substrate to the inclined plane of the array substrate and extend from the inclined plane of the array substrate to the second surface of the array substrate.

13. The liquid crystal display device according to claim 10, wherein the color filter substrate comprises a substrate and a first color filter layer disposed in a display area of the substrate, and the frame glue is disposed between the substrate and the array substrate.

14. The liquid crystal display device according to claim 10, wherein the color filter substrate comprises a substrate, a first color filter layer disposed on the substrate, and a second color filter layer disposed on the substrate; wherein the second color filter layer is disposed outside the first color filter layer and adjacent to an outer edge of the color filter substrate, and the second wires extend from the array substrate to a side surface of the second color filter layer and extend from the side surface of the second color filter layer to the substrate.

* * * * *